United States Patent
Winkle et al.

(10) Patent No.: US 7,932,016 B2
(45) Date of Patent: Apr. 26, 2011

(54) PHOTOSENSITIVE COMPOSITION

(75) Inventors: Mark R. Winkle, Lansdale, PA (US); Jill E. Steeper, Melrose, MA (US); Xiang-Qian Liu, Norristown, PA (US); Janet Okada-Coakley, Boylston, MA (US); Scott A. Ibbitson, Trappe, PA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/594,551

(22) Filed: Nov. 8, 2006

(65) Prior Publication Data

US 2007/0105046 A1  May 10, 2007

Related U.S. Application Data

(60) Provisional application No. 60/734,599, filed on Nov. 8, 2005.

(51) Int. Cl.
G03F 7/028 (2006.01)
G03F 7/027 (2006.01)
G03F 7/033 (2006.01)

(52) U.S. Cl. ............... 430/322; 430/281.1; 430/324; 430/329

(58) Field of Classification Search ........... 430/270.1, 430/271.1, 275.1, 281.1, 286.1, 309, 315, 430/322, 324, 329
See application file for complete search history.

(56) References Cited

U.S. PATENT DOCUMENTS

| | | | |
|---|---|---|---|
| 3,832,176 A | 8/1974 | Verstraete et al. | |
| 4,273,857 A * | 6/1981 | Leberzammer et al. | 430/281.1 |
| 4,353,978 A | 10/1982 | Leberzammer et al. | 430/302 |
| 4,629,680 A | 12/1986 | Iwasaki et al. | 430/288 |
| 4,701,399 A | 10/1987 | Nagano et al. | 430/179 |
| 5,112,721 A | 5/1992 | Kuchta | 430/281 |
| 5,149,776 A | 9/1992 | Kushi et al. | 430/288 |
| 5,288,589 A | 2/1994 | McKeever et al. | 430/262 |
| 5,773,194 A | 6/1998 | Hattori et al. | 430/285.1 |
| 5,912,106 A | 6/1999 | Chang et al. | 430/281.1 |
| 5,962,190 A * | 10/1999 | McKeever | 430/281.1 |
| 5,965,328 A | 10/1999 | Sano et al. | 430/315 |
| 6,342,332 B1 | 1/2002 | Loo et al. | 430/270.1 |
| 6,391,523 B1 * | 5/2002 | Hurditch et al. | 430/280.1 |
| 6,447,979 B1 * | 9/2002 | Hattori et al. | 430/270.1 |
| 2002/0142244 A1 * | 10/2002 | Takashima et al. | 430/138 |
| 2003/0170568 A1 | 9/2003 | Misev et al. | 430/281.1 |
| 2004/0018724 A1 | 1/2004 | Forman et al. | 438/669 |
| 2004/0033317 A1 | 2/2004 | Baudin et al. | 427/487 |
| 2004/0034115 A1 | 2/2004 | Baudin et al. | 522/33 |
| 2004/0058087 A1 * | 3/2004 | Baudin et al. | 427/487 |
| 2004/0063025 A1 | 4/2004 | Natori et al. | 430/270.1 |
| 2005/0238968 A1 * | 10/2005 | Caspar et al. | 430/7 |

FOREIGN PATENT DOCUMENTS

| | | | |
|---|---|---|---|
| EP | 0762208 A2 | * | 12/1997 |
| EP | 0 961 171 | | 12/1999 |
| GB | 1 507 704 | | 4/1978 |
| GB | 2 198 736 | | 6/1988 |
| GB | 2 278 847 | | 12/1994 |
| WO | WO2004/049071 | * | 6/2004 |

OTHER PUBLICATIONS

Lehar et al., "Solvent Content of Thick Photoresist Films", In Advances in Resist Technology and Processing XVII, Francis M. Houlihan, Editor, Proceedings of SPIE vol. 3999 (2000), pp. 442-451.

Lehar et al., "Resist Re-Hydration During Thick Film Processing", Advances in Resist Technology and Processing XVIII, Francis M. Houlihan, Editor, Proceedings of SPIE vol. 4345 (2001), pp. 463-474.

\* cited by examiner

*Primary Examiner* — Cynthia H Kelly
*Assistant Examiner* — Anca Eoff
(74) *Attorney, Agent, or Firm* — Jonathan D. Baskin

(57) ABSTRACT

Photoresist compositions and methods suitable for depositing a thick photoresist layer in a single coating application are provided. Such photoresist layers are particularly suitable for use in chip scale packaging, for example, in the formation of metal bumps.

13 Claims, No Drawings

PHOTOSENSITIVE COMPOSITION

The present invention relates generally to photosensitive compositions. More particularly, the present invention relates to photosensitive compositions useful in the formation of thick photoresist layers. The present invention finds particular applicability in chip-scale packaging in the formation of metal bumps on semiconductor wafers.

Thick photoresist layers are useful in the formation of large mechanical structures such as solder bumps on semiconductor wafers for chip-scale packaging. In such processes, a substrate is typically coated multiple times with photoresist to provide a thick photoresist layer. Conventional photoresists typically provide a single layer coated thickness of from about 1 to 10 μm. Multiple coating steps are used where a thick photoresist layer, for example, from 15 to 100 μm in thickness, is desired. The photoresist layer is then patterned by conventional exposure and development procedures. Following development, a metal such as copper, tin, lead, gold or a mixture thereof is deposited into the openings in the patterned resist. After metal deposition, the thick photoresist is removed and the metal deposit is optionally reflowed to provide a series of somewhat spherically shaped metal bumps. The use of multiple coating steps to produce a thick photoresist layer is not economical, as each step adds to the total process time, as well as to the monetary cost of the process and resulting electronic devices. Provision of a photosensitive composition which may be used to form a thick layer in a single coating step would therefore be desirable.

Negative photoresists that use photoinitiated free radical polymerization to polymerize ethylenically unsaturated monomers in exposed regions are known. With such photoresists, the polymerized exposed regions are rendered insoluble in subsequent development, while the unexposed resist readily dissolves in the developer solution. The photoresist image resulting from this process should accurately reproduce the image of the photomask used during the exposure process. Typically, however, free radical polymerization-type photoresists produce images that extend beyond the exposed areas into unexposed areas of the resist, resulting in the formation of wider than desired resist patterns. This effect can be particularly problematic in the case of thick layer, high aspect ratio applications. A further problem associated with imaging of thick photoresist layers results from the inability of oxygen in air to diffuse from the resist surface through the entire depth of the resist layer. In this regard, free-radical inhibitors used in many photoresist compositions require the presence of oxygen to function. Such inhibitors are thus believed to be ineffective for polymerization inhibition of thick resist layers.

To address the foregoing problems, the present inventors have found that the use of a stable free-radical inhibitor in the photosensitive compositions of the invention allows for accurate imaging of thick layers of such compositions. The stable free-radical inhibitors have been found to confine polymerization in the photosensitive compositions to exposed regions, preventing unwanted growth into the unexposed regions, and are effective in the presence or absence of oxygen.

U.S. Patent Application Publication No. 2004/0063025, to Natori et al, discloses a photosensitive resin composition that is purportedly suitable for use in forming a photoresist resist pattern having a high resolution and aspect ratio. The compositions include a binder polymer, a photopolymerizable compound having three ethylenically unsaturated bonds per molecule, a photo-polymerization initiator, and a compound for suppressing unwanted gelling due to scattered light. The disclosed compositions do not include stable free-radical inhibitors.

In accordance with a first aspect of the invention, a photosensitive composition is provided. The composition includes: a binder polymer prepared by free radical polymerization of acrylic acid and/or methacrylic acid with one or more monomers chosen from acrylate monomers, methacrylate monomers and vinyl aromatic monomers; a free radical polymerizable monomer bearing two or more ethylenically unsaturated groups, a free radical photoinitiator; and a stable free radical inhibitor. The composition advantageously is capable of being coated to a dried thickness, for example, of greater than 100 microns by spin coating in a single application. Suitable binder polymers include, for example, those prepared by free radical polymerization of ethyl acrylate, methyl methacrylate, and methacrylic acid. Suitable stable free radical inhibitors include, for example, 2,2,6,6-tetramethyl-1-piperidinyloxy, 2,2-diphenyl-1-picrylhydrazyl, and derivatives thereof.

In accordance with a further aspect of the invention, dry-film photoresists are provided. The dry-film photoresists include a releasable carrier substrate and a photosensitive layer over the carrier substrate. The photosensitive layer includes a photosensitive composition such as described above.

In accordance with a further aspect of the invention, methods of forming a photoresist pattern on a substrate are provided. The methods involve: (a) disposing over a substrate a photosensitive layer comprising a composition such as described above with respect to the first aspect; (b) imagewise exposing the photoresist layer to actinic radiation; and (c) developing the exposed layer, thereby forming a patterned layer. The substrate may be, for example, an electronic device substrate such as a semiconductor wafer. The method may advantageously be used to form metal bumps, such as solder bumps, on the surface of the substrate by depositing a metal over exposed areas of the substrate, and removing the patterned layer to provide a semiconductor wafer having metal bumps.

As used throughout this specification, the following abbreviations shall have the following meanings, unless the context clearly indicates otherwise: ° C. is degrees Centigrade; g is grams; mJ is millijoules; cm is centimeter; rpm is revolutions per minute; sec. is second; min. is minute; μm is micrometer; wt % is percent by weight; and $M_W$ is weight average molecular weight as measured by size exclusion chromatography (SEC).

The terms "resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Polymers" refer to both homopolymers, copolymers and polymer prepared from three or more different monomers, and include dimers, trimers, oligomers and the like. The term "(meth)acrylate" refers to both acrylate and methacrylate. Likewise, the term "(meth)acrylic" refers to both acrylic and methacrylic. "Monomer" refers to any ethylenically unsaturated compound capable of being polymerized. The terms "cross-linker" and "cross-linking agent" are used interchangeably throughout this specification and refer to compounds that contain two or more sites of ethylenic unsaturation. The terms "thick photoresist" or "thick photoresist layer" are used throughout this specification to refer to a photoresist layer having a thickness of 5 μm or more. "Very thick photoresist" and "very thick photoresist layers" refer to a photoresist layer having a thickness of 50 µm or more, for example, 100 µm or more.

All amounts are percent by weight and all ratios are by weight, unless otherwise noted. All numerical ranges are inclusive and combinable in any order, except where it is obvious that such numerical ranges are constrained to add up to 100%.

The photosensitive compositions of the invention include a binder polymer prepared by free radical polymerization of acrylic acid and/or methacrylic acid with one or more monomers chosen from acrylate monomers, methacrylate monomers and vinyl aromatic monomers. The binder polymers may include one or more other monomers as polymerized units.

Suitable (meth)acrylate monomers include, for example, alkyl (meth)acrylates, alkenyl (meth)acrylates and aromatic (meth)acrylates.

The alkyl (meth)acrylate monomers useful in the present invention may be linear or cyclic, and may take the form of a single monomer or a mixture having different numbers of carbon atoms in the alkyl portion. Typically, the alkyl (meth) acrylates useful in the present invention are $(C_1-C_{24})$alkyl (meth)acrylates, for example, $(C_1-C_8)$alkyl(meth)acrylates. Examples are methyl(meth)acrylate, ethyl(meth)acrylate, propyl(meth)acrylate, 2-propyl (meth)acrylate, butyl(meth) acrylate, 2-butyl(meth)acrylate, 2-methylpropyl(meth)acrylate, hexyl(meth)acrylate, cyclohexyl(meth)acrylate, octyl (meth)acrylate, and 2-ethylhexyl(meth)acrylate. Of these, methyl(meth)acrylate is typical. A suitable alkenyl(meth) acrylate includes, for example, allyl(meth)acrylate. Suitable aromatic(meth)acrylates include, for example, phenyl(meth) acrylate and benzyl(meth)acrylate.

The (meth)acrylate monomers useful in the present invention may optionally be substituted. Suitable optionally substituted alkyl (meth)acrylate monomers include, but are not limited to: hydroxy$(C_2-C_6)$alkyl(meth)acrylates, dialkylamino$(C_2-C_6)$-alkyl(meth)acrylates. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. Other substituted (meth)acrylate monomers useful in the present invention are silicon-containing monomers such as γ-propyl tri$(C_1-C_6)$alkoxysilyl(meth)acrylate, γ-propyl tri$(C_1-C_6)$ alkylsilyl(meth)acrylate, γ-propyl di$(C_1-C_6)$alkoxy$(C_1-C_6)$ alkylsilyl(meth)acrylate, γ-propyl di$(C_1-C_6)$alkyl$(C_1-C_6)$ alkoxysilyl(meth)acrylate, 2-propylsilsesquioxane(meth) acrylate and mixtures thereof.

The vinyl aromatic monomers useful as unsaturated monomers in the present invention include, but are not limited to: styrene, hydroxystyrene, α-methylstyrene, vinyltoluene,p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, $(C_1-C_{10})$alkoxy, halo$(C_1-C_{10})$alkyl, carb $(C_1-C_{10})$alkoxy, carboxy, amino, $(C_1-C_{10})$alkylamino derivatives and the like.

Additional types of monomers may be used in preparing the binder polymer. Suitable monomers include, but are not limited to nitrogen-containing compounds, substituted ethylene monomers, cyclic olefins, substituted cyclic olefins and (meth)acrylamides.

The nitrogen-containing compounds useful as unsaturated monomers in the present invention include, but are not limited to: vinylpyridines such as 2-vinylpyridine or 4-vinylpyridine; $(C_1-C_8)$alkyl substituted N-vinylpyridines such as 2-methyl-5-vinylpyridine, 2-ethyl-5-vinylpyridine, 3-methyl-5-vinylpyridine, 2,3-dimethyl-5-vinylpyridine, and 2-methyl-3-ethyl-5-vinylpyridine; methyl-substituted quinolines and isoquinolines; N-vinylcaprolactam; N-vinylbutyrolactam; N-vinylpyrrolidone; vinylimidazole; N-vinylcarbazole; N-vinyl-succinimide; (meth)acrylonitrile; o-, m-, or p-aminostyrene; maleimide; N-vinyloxazolidone; 2-(N,N-dimethylamino)ethyl vinyl ether; ethyl 2-cyanoacrylate; vinylacetonitrile; N-vinylphthalimide; N-vinylpyrrolidones such as N-vinylthiopyrrolidone, 3-methyl-1-vinylpyrrolidone, 4-methyl-1-vinylpyrrolidone, 5-methyl-1-vinylpyrrolidone, 3-ethyl-1-vinylpyrrolidone, 3-butyl-1-vinylpyrrolidone, 3,3-dimethyl-1-vinylpyrrolidone, 4,5-dimethyl-1-vinylpyrrolidone, 5,5-dimethyl-1-vinylpyrrolidone, 3,3,5-trimethyl-1-vinylpyrrolidone, 4-ethyl-1-vinylpyrrolidone, 5-methyl-5-ethyl-1-vinylpyrrolidone and 3,4,5-trimethyl-1-vinylpyrrolidone; vinylpyrroles; vinyl anilines vinylanilines; and vinylpiperidines.

The substituted ethylene monomers useful as unsaturated monomers in the present invention include, but are not limited to: vinyl acetate, vinylformamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate and vinyl ethers.

Suitable (meth)acrylamides for use in the invention include, for example, alkyl (meth)acrylamides. The (meth) acrylamide monomers may optionally be substituted, for example, dialkylamino$(C_2-C_6)$alkyl(meth)acrylamides.

The binder polymer includes as polymerized units one or more base developable group-containing monomers, making the photosensitive composition developable in an aqueous base developer solution. In addition to the polymerized units of (meth)acrylic acid monomers, suitable monomers containing base developable groups include, for example, itaconic acid, (meth)acryloxypropionic acid, itaconic acid, aconitic acid, maleic acid or anhydride, fumaric acid, crotonic acid, monomethyl maleate, monomethyl fumarate and monomethyl itaconate.

The binder polymers may be prepared by any known means such as emulsion, solution or suspension polymerization. After polymerization, the polymers prepared by emulsion or suspension polymerization may be isolated and then taken up in any suitable organic solvent. Such methods are well known to those skilled in the art.

The solution polymers of the present invention are generally prepared by first charging a solvent heel or alternatively a mixture of solvent and some portion of the monomer mixture to a reaction vessel equipped with a stirrer, a thermometer and a reflux condenser. The monomer mixture may be composed of monomer, initiator and optional chain transfer agent, as appropriate. These components may alternatively be fed individually. Peroxide initiators (for example t-amyl peroxypivalate and t-butyl peroxy-2-ethylhexanoate) and diazo initiators (for example, 2,2'-azobis(isobutyronitrile), 2,2'-azobis (2-methylbutanenitrile) and 2,2'-azobis(2,4-dimethylpentanenitrile)) are typical. The solvent or solvent/ monomer mixture heel is typically heated with stirring under a nitrogen blanket to a temperature from about 55° C. to about 125° C. After the heel charge has reached a temperature sufficient to initiate polymerization, the monomer mixture or balance of the monomer mixture is charged to the reaction vessel over a period of 15 minutes to 4 hours while maintaining the reaction at the desired reaction temperature. After completing the monomer mixture addition, a series of additional aliquots of initiator in solvent may be charged to the reaction. Typically, the initiator is charged to the reaction and followed by a hold period to allow for reaction to occur before adding the next initiator amount. Typically two or three initiator additions are used. After the final initiator amount is added the batch is held for 30 minutes to 4 hours to fully decompose all initiator and drive the reaction to completeness.

The molecular weight of the binder polymers used in the invention typically have a weight average molecular weight of less than 250,000, although higher molecular weights may be employed. Typically, the weight average molecular weight ranges from about 10,000 to about 250,000, and more typically from about 10,000 to about 50,000, for example, from about 10,000 to about 25,000. The binder polymers are typically used in an amount of from 45 to 90 wt %, for example, from 50 to 85 wt %.

The free radical polymerizable monomers of the photosensitive composition bear two or more ethylenically unsaturated groups. Suitable such monomers include di-, tri-, tetra-, or higher order multi-functional ethylenically unsaturated monomers, for example, multifunctional (meth)acrylate monomers. Suitable free radical polymerizable monomers include, but are not limited to, divinylbenzene, allyl methacrylate; 1,4-benzenediol diacrylate; 1,4-benzenediol dimethacrylate; bis-(acryloxyethyl)phosphate; bisphenol-A diacrylate; bisphenol-A dimethacrylate; 1,3-butanediol diacrylate; 1,3-butanediol dimethacrylate; 1,4-butanediol diacrylate; 1,4-butanediol dimethacrylate; 2-butene-1,4-diol diacrylate; 2-butene-1,4-diol dimethacrylate; 1,2,4-butanetriol trimethacrylate; crotyl acrylate; crotyl methacrylate; 1,4-cyclohexanediol diacrylate; 1,4-cyclohexanediol dimethacrylate; decamethylene glycol diacrylate; decamethylene glycol dimethacrylate; diallyl isocyanurate; diallyl itaconate; diethylene glycol diacrylate; diethylene glycol dimethacrylate; di-(3-acryloxyethyl)ether of bisphenol-A; di-(acryloxy-2-hydroxypropyl)ether of bisphenol-A; diallyl fumarate; diisoproprenylbenzene; di-(3-methacryloxyethyl) ether of bisphenol-A; di-(3-methacryloxy-2-hydroxypropyl) ether of bisphenol-A; di-(3-methacryloxy-2-hydroxypropyl) ether of tetrachlorobisphenol-A; di-(3-methacryloxy-2-hydroxypropyl)ether of tetrabromobisphenol-A; di-(3-methacryloxy-2-hydroxypropyl)ether of 1,4-butanediol; di-(3-methacryloxy-2-hydroxypropyl)ether of diphenolic acid; 2,2-dimethyl-1,3-propanediol diacrylate; 2,2-dimethyl-1,3-propanediol dimethacrylate; dipropylene glycol dimethacrylate; ethylene glycol diacrylate; ethylene glycol dimethacrylate; gycerol triacrylate; gycerol trimethacrylate; hexamethylene glycol diacrylate; hexamethylene glycol dimethacrylate; hydrogenated bisphenol-A dimethacrylate; melamine acrylate; methallyl ethacrylate; N,N'-methylenebisacrylamide; 1,9-nonanediol dimethacrylate; 1,5-pentanediol diacrylate; 1,5-pentanediol dimethacrylate; pentaerythritol tetraacrylate; pentaerythritol tetramethacrylate; pentaerythritol triacrylate; pentaerythritol trimethacrylate; 1-phenyl-1,2-ethanediol dimethacrylate; polyoxyethyl-2,2-di(p-hydroxyphenyl)propane diacrylate; polyoxyethyl-2,2-di(p-hydroxyphenyl)propane dimethacrylate; polyoxypropyltrimethylolpropane triacrylate; 1,3-propanediol diacrylate; 1,2-propanediol dimethacrylate; 1,3-propanediol dimethacrylate; propoxylated bisphenol-A dimethacrylate; tetraethylene glycol diacrylate; tetraethylene glycol dimethacrylate; 1,3,5-triacryloylhexahydro-s-trazine; triethylene glycol diacrylate; triethylene glycol dimethacrylate; 1,3,5-isopropenylbenzene; trimethylolethane triacrylate; trimethylolpropane diallyl ether mono-methacrylate; trimethylolpropane triacrylate; trimethylolpropane trimethacrylate; 2,2,4-trimethyl-1,3-pentanediol dimethacrylate; tripropylene glycol diacrylate; tris-(2-acryloxyethyl)isocyanurate; and tris-(2-methacryloxyethyl) isocyanurate. Also useful are the acrylate and methacrylate esters of polyalkoxylated compounds such as those described in U.S. Pat. Nos. 3,594,410, 4,180,474 and 4,382,135; polyoxyethylated trimethylolpropane triacrylate and trimethacrylate and similar compounds as disclosed in U.S. Pat. No. 3,380,831. Other suitable free radical polymerizable monomers are well-known to those skilled in the art.

Typical free radical polymerizable monomers include ethyleneglycol diacrylate, trimethylolpropane triacrylate, ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof.

The amount of the free radical polymerizable monomer may vary over a wide range. In general, the amount free radical polymerizable monomer is from 10 to 30 wt %, typically, from 15 to 30 wt %. Typically, the weight ratio of the binder polymer to the free radical polymerizable monomer is from 1:1 to 10:1, typically 1.5:1 to 9:1, and more typically 2:1 to 7:1.

One or more free radical photoinitiators are used in the photosensitive composition for initiating polymerization of the cross-linking agents by generation of free-radicals. Suitable free radical photoinitiators include, for example, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18, the disclosure of which is incorporated by reference herein; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoactive components which are also useful are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; and 3,097,096 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators.

Also useful with photoinitiators are sensitizers as disclosed in U.S. Pat. No. 4,162,162. Though, not a free-radical generator, triphenylphosphine may be included in the photoactive chemical system as a catalyst. Such free-radical generators are particularly suitable for use with negative-acting photoimageable compositions.

Particularly suitable photoactive components include: 3-phenyl-5-isoxazolone/benzanthrone; 2-t-butylanthraquinone; 2,2-dimethoxy-2-phenylacetophenone; 1-hydroxycyclohexyl phenyl ketone, and diethoxyacetophenone. Other suitable photoinitiators are disclosed in Nippon Kagaku Kaisha No. 1192-199 (1984) and include 2,4,6,-tris (trichloromethyl)-1,3,5-triazine with 3,3'-carbonyl bis(7-diethylaminocoumarin), 1-methyl-2-benzylmethylene-1,2-dihydronaphthol(1,2d)thiazole, or 9-phenylacridine; 2-mecaptobenzimidazole with 9-phenylacridine; and 3-phenyl-5-isoxazoline with 9-fluorenone or 1-methyl-2-benzylmethylene-1,2-dihydronaphtho(1,2d)thiazole.

Typical photoactive components are ketones having morpholino and S-phenyl groups, such as those disclosed U.S. Pat. 4,582,862 (Berner et al.), herein incorporated by reference. An exemplary photoactive component is 2-methyl-1-[4-(methylthio)phenyl]-2-morpholinopropan-1-one.

Mixtures of photoactive components may optionally be used. When two photoactive components are used, they may be used in any ratio, such as from 99:1 to 1:99. Typically, such photoactive components are present in an amount of from 0.05 to 10 wt % based on the total weight of the composition, typically from 0.1 to 5 wt %, and more typically from 0.1 to 2 wt %. The compositions further include one or more stable free radical inhibitor. Without wishing to be bound by any particular theory, it is believed that the free radical inhibitor terminates the radicals that grow into unexposed regions of the resist. In this way, the growth of radicals into the unexposed areas is controlled such that polymerization is confined to the exposed areas. As a result, the mask pattern may accurately be reproduced in the resulting photoresist image. The stable free radical inhibitors are anaerobic, meaning that they do not require the presence of oxygen for efficient polymerization inhibition. This is particularly desirable for thick resist layers exposed to actinic radiation in air, which layers would not be capable of activating an aerobic inhibitor due to inability of oxygen to diffuse from the layer surface through the entire layer during exposure. Suitable stable free radical inhibitors are those that react rapidly with carbon free radicals. Examples of such inhibitors are 2,2,6,6-tetramethylpiperidine-1-oxyl, 2,2-diphenyl-1 -picrylhydrazyl, derivatives of these compounds, and combinations thereof. Such derivatives of 2,2,6,6-tetramethylpiperidine-1-oxyl include, for example: 4-hydroxy-2,2,6,6-tetramethyl-1-piperidinyloxy; 4-amino-2,2,6,6-tetramethyl-1-piperidinyloxy; 4-Acetamido-2,2,6,6-tetramethylpiperidine 1-oxyl; 2,2,6,6-tetramethyl-4-oxo-1-piperidinyloxy; 4-methoxy-2,2,6,6-tetramethyl-1-piperidinyloxy; 4-Hydroxy-2,2,6,6-tetramethylpiperidine1-oxyl benzoate; 4-cyano-2,2,6,6-tetramethyl-1-piperidinyloxy; and 4-carboxy-2,2,6,6-tetramethyl-1-piperidinyloxy. Suitable derivatives of 2,2-diphenyl-1-picrylhydrazyl include, for example: 2,2-diphenyl-1-picryl-hydrazyl and 2,2-di(4-tert-octylphenyl)-1-picrylhydrazyl. These inhibitors are commercially available.

The amount of the stable free radical inhibitor in the photosensitive compositions will depend on the other components, for example, the free radical polymerizable monomer bearing two or more ethylenically unsaturated groups. The stable free radical inhibitor is typically present in an amount of from 0.04 to 0.3 wt % based on the total weight of the composition.

It may be advantageous in certain instances to employ in the compositions a free radical inhibitor that is not a stable free radical inhibitor in addition to the stable free radical inhibitor. Suitable such additional inhibitors include, for example: hydroquinone; para-benzoquinone; phenothiazine; 4-methoxyphenol; 2-methoxyphenol; 4-ethoxyphenol; 4-propoxyphenol; 4-butoxyphenol; 1,2- dihydroxybenzene; pyrogallol; 2-aminophenol; 4-aminophenol; 2-mercaptophenol; 4-mercaptophenol; hydroquinone monobenzyl ether; 2,5-dichlorhydroquinone; 2,5-di-tert-butylhydroquinone; 2-acetylhydroquinone; hydroquinone monobenzoate; 2,3,5-trimethylhydroquinone; 2-(N,N-dimethylamino)phenol; 4-(ethylamino)phenol; 2-(methylthio)phenol; and t-butylcatechol. The photosensitive compositions may, however, be free of such additional inhibitors.

The compositions typically further include a solvent such as an organic solvent that dissolves or suspends the binder polymer, the cross-linking agent and the photoactive component. Exemplary organic solvents include, but are not limited to: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof; cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethylformamide, N,N-dimethylacetamide, N-methyl-2-pyrrolidone, 3-ethoxyethyl propionate, 2-heptanone, γ-butyrolactone, and mixtures thereof.

The amount of solvent used in the present compositions is that amount necessary to provide compositions having a total solids content of 45 wt % or greater. Other particularly useful compositions are those having a total solids content of 50 wt % or more, 55 wt % or more, 60 wt % or more, and 65 wt % or more.

A variety of optional additives may be used in the present compositions, including, but not limited to: anti-striation agents, plasticizers, fillers, dyes, film forming agents, and the like. Such optional additives will be present in various concentrations in a photoresist composition. For example, fillers and dyes may be used in relatively large concentrations, for example, in amounts of from about 5 to 30 wt %, based on the total weight of the composition's dry components.

The photosensitive compositions of the present invention are typically prepared by combining the binder polymer, free radical polymerizable monomer, free radical photoinitiator, stable free radical inhibitor, solvent and optional additives, in any order.

An advantage of the present photosensitive compositions is that they can be used to deposit a layer having a thickness of 50 μm or more, for example, greater than 100 μm, greater than 110 μm, greater than 120 μm, greater than 150 μm, greater than 200 μm, or greater than 250 μm, in a single-step coating process. Photosensitive layers having a thickness, for example, of up to 275 μm or more, are envisioned in a single-step coating process according to the present invention. The layers formed by the photosensitive compositions have thicknesses which are uniform. For example, a uniformity of ±5% for a thickness of about 100 μm is typical. Although a single-step process may be used, in certain instances it may be advantageous to use multiple coating steps to build up the desired thickness. The present compositions may be used in such multiple-step coating processes.

In accordance with a further aspect of the invention, provided is a method for forming a photoresist pattern on a substrate. The method involves: (a) disposing over a substrate a photosensitive layer comprising a photosensitive composition such as described above; (b) imagewise exposing the photoresist layer to actinic radiation; and (c) developing the exposed layer, thereby forming a patterned layer.

The photosensitive composition may be applied to a variety of electronic device substrates, including, but not limited to, printed wiring boards, lead frames, semiconductor wafers, semiconductor packaging, and the like. The present composition is particularly suitable for use in depositing metal bumps, such as solder bumps, on a semiconductor wafer. For purpose of illustration, an exemplary method will be described using a negative-acting photosensitive composition for metal bump formation on a semiconductor wafer.

The photosensitive composition described above is disposed on a semiconductor wafer by suitable method, such as, but not limited to, spin coating, dip coating, roller coating, screen printing, and the like. An amount of the photosensitive composition is disposed on a semiconductor wafer. In one embodiment, the photosensitive composition is disposed on a conductive layer, particularly when the process is used to deposit metal bumps on a semiconductor wafer. The specific amount of the photosensitive composition depends upon the particular components of the photosensitive composition as well as the desired thickness of the resulting photosensitive layer. Typically, the photosensitive composition is disposed onto the center of the wafer, such wafer being either static or rotating. The wafer is then spun at a speed and for a time sufficient to provide a layer of the photosensitive composition having the desired thickness, the layer being substantially uniform in thickness across the wafer. Suitable spin spends are from 100 to 1500 rpm, but higher or lower spin speeds may be suitably employed. In one embodiment, the wafer is first spun at a speed of 100 to 700 rpm for a period of time, such as from 1 to 20 seconds, and then spun at a second speed of 500 to 1000 rpm for a period of time, such as from 1 to 30 seconds. The wafer may optionally be allowed to sit for a period of time prior to soft baking.

The photosensitive composition is typically soft baked, which involves heating the composition to ensure solvent evaporation. Such soft baking is typically done by placing the wafer on a hot plate, for example, at 65° to 120° C., for a period of time, such as for 30 seconds to 5 minutes. As a third step, any topside edge bead is typically removed after the soft baking step. Any conventional edge bead removal process may be suitably employed. During such edge bead removal, the wafer is typically spun at a speed of 1000 rpm or less and typically 700 rpm or less. The photosensitive composition is then hard baked, e.g. at 90° to 120° C. for 3 to 10 minutes, as a fourth step. After the hard baking step, the wafer is typically cooled.

Next, the photosensitive composition is imaged through a mask using actinic radiation of the appropriate wavelength for the photoactive component, such as 248 nm, 193 nm, 157 nm, EUV, e-beam, and the like to provide a relief image. Typically, the photosensitive composition is imaged at 365 nm. A "mask" as used herein refers to a photomask or artwork used to provide the pattern to be imaged. In general, the present photosensitive compositions are exposed at an energy of 200 to 1800 mJ, and typically from 800 to 1200 mJ.

The developer is typically an aqueous alkaline composition. Suitable aqueous developers include, for example, alkali metal hydroxides such as sodium hydroxide and potassium hydroxide in water, as well as tetraalkylammonium hydroxide such as tetramethylammonium hydroxide in water. Such developers are typically used in concentrations from 0.1 to 2N, for example from 0.15 to 1N. The developer solutions may optionally include one or more known surfactants, such as polyethylene glycol, alkyl sulfonates, and other surfactants well known in the art. When used, the surfactant is typically present in the developer solution in an amount of from 0.5 to 3 wt %. The developers are typically used at a temperature of from room temperature to about 60° C., for example, from 35° to 45° C.

The layer of photosensitive composition is imaged so as to form apertures such as vias in the photosensitive layer. In such process, the photosensitive layer is disposed on a conductive layer on the electronic device. Exposure of the photosensitive composition and subsequent development provides defined holes (vias) in the photosensitive composition and exposes the underlying conductive layer. Accordingly, the next step of the process is to deposit metal or metal alloy bumps within the defined holes (vias). Such metal deposition may be by electroless or electrolytic deposition processes. Electrolytic metal deposition is typical. In an electrolytic metal deposition process, the electronic device substrate, for example, the semiconductor wafer, functions as the cathode.

Prior to coating of the photosensitive layer and deposition of the bump metal or metal alloy, such as that suitable as a solder, a conductive layer such as copper or nickel may be deposited by sputtering, electroless deposition and the like, to form an under-bump-metal. Such under-bump-metal layer is typically from 1000 to 50,000 Å in thickness and acts as a wettable foundation to the subsequently plated solder bump.

A wide variety of metals may be deposited electrolessly, including, but not limited to, copper, tin-lead, nickel, gold, silver, palladium, and the like. Suitable metals and metal alloys that may be deposited electrolytically include, but are not limited to, copper, tin, tin-lead, nickel, gold, silver, tin-antimony, tin-copper, tin-bismuth, tin-indium, tin-silver, palladium, and the like. Such metal plating baths are well known to those skilled in the art and are readily available from a variety of sources, such as Rohm and Haas Electronic Materials LLC, Marlborough, Mass.

In one embodiment, the metal deposits on the semiconductor wafer are useful as solder bumps. Accordingly, it is typical that the metal bumps are solderable metals and metal alloys, such as tin, tin-lead, tin-copper, tin-silver, tin-bismuth, tin-copper-bismuth, tin-copper-silver, and the like. Suitable metals and metal alloys for solder bump formation are disclosed in U.S. Pat. Nos. 5,186,383; 5,902,472; 5,990,564; 6,099,713; and 6,013,572, as well as European Patent Application No. EP 1 148 548 (Cheung et al.). Exemplary metals and metal alloys include, but are not limited to: tin; tin-copper alloy having less than 2 wt % copper and typically about 0.7 wt % copper; a tin-silver alloy having less than 20 wt % silver and typically from 3.5 to 10 wt % silver; a tin bismuth alloy having from 5 to 25 wt % bismuth and typically about 20 wt % bismuth; and a tin-silver-copper alloy having less than 5 wt % silver and typically about 3.5 wt % silver, less than 2 wt % copper and typically about 0.7 wt % copper, and the balance being tin. In one embodiment, the metal alloys used for solder bumps are lead-free, i.e. they contain ≦10 ppm of lead.

In general, suitable electrolytic metal plating baths are acidic and contain acid, water a soluble form of the metal or metals to be deposited and optionally one or more organic additives, such as brighteners (accelerators), carriers (suppressors), levelers, ductility enhancers, wetting agents, bath stabilizers (particularly for tin-containing baths), grain refiners and the like. The presence, type and amount of each optional component varies depending upon the particular metal plating bath used. Such metal plating baths are generally commercially available, such as from Shipley Company.

Binary alloys may be deposited from a single bath, as in the case of tin-copper, tin-bismuth, tin-silver, tin-lead and the like, or may be deposited as individual layers from multiple plating baths and reflowed to form and alloy. Such reflow technique is described in U.S. Pat. No. 6,013,572. Such reflow is typically performed after removal of the remaining photosensitive composition.

In such a process, the photosensitive composition functions as a protective layer to areas that are not to be plated. Following metal deposition, the remaining photosensitive composition is stripped, such as by using a commercially available N-methylpyrrolidone ("NMP") based stripper at a temperature of about 40° to 69° C. Suitable strippers are available from a variety of sources, such as Rohm and Haas Electronic Materials LLC. Metal bumps are thus formed on the semiconductor wafer.

In accordance with a further aspect of the invention, the photosensitive compositions of the invention may be used to form dry-film photoresists. The inventive dry-films are suitable for use in forming the structures described above, for example, metal bumps, such as solder bumps, on a semiconductor wafer. The dry-films include a releasable carrier substrate and a photosensitive layer over the carrier substrate. The photosensitive layer is formed from a photosensitive composition as described above. The dry film typically includes a protective cover layer on the front surface of the dry-film over the photosensitive layer.

The carrier substrate functions as a mechanical support for the photosensitive layer and any other layers of the dry-film during manufacture, storage and subsequent processing. Suitable carrier substrate materials include, for example: polyethylene terephthalate (PET), which may be treated in various ways, for example, resin-coated, flame or electrostatic discharge-treated, or slip-treated; a paper such as polyvinyl alcohol-coated paper, crosslinked polyester-coated paper, polyethylene-coated paper, cellulose paper, or a heavy paper such as lithographic paper; nylon; glass; cellulose acetate; a synthetic organic resin; a polyolefin such as polypropylene; a polyimide; a polyurethane; a polyacrylate such as polymethylmethacrylate (PMMA); fiberboard; a metal such as copper, aluminum, tin, magnesium, zinc, nickel, or an alloy thereof; and a multilayered structure of two or more of these or other materials, for example, a copper-coated fiberboard or epoxy laminate. The carrier substrate typically has a thickness, for example, of from about 25 to 250 μm.

The protective cover layer provides protection to the polymeric layer, and is typically in the form of a removable film or sheet that may be peeled from the remainder of the dry-film. Adhesion of the protective cover layer to the polymeric layer is less than that of the carrier substrate to the polymeric layer. This allows for separation of the protective cover layer from the polymeric layer without also separating the polymeric layer from the carrier substrate. Suitable materials for the protective cover layer include, for example, polyolefins such as polyethylene and polypropylene, polyvinyl alcohol, and PET. The protective cover layer typically has a thickness of from about 10 to 100 μm. Optionally, the protective cover layer may include a first layer coated with a release layer which contacts the polymeric layer. Suitable release layer materials include, for example, thermally or photochemically cured silicones, polyvinyl stearate, polyvinyl carbamates, poly N-ethylperfluorooctyl sulfanamidoethyl methacrylate, poly(tetrafluorothylene), polypropylene, polymethyl methacrylate, polysiloxanes, polyamides, and other release materials such as those described in Satas, *Handbook of Pressure Sensitive Adhesive Technology*, $2^{nd}$ ed., Van Nostrand/Reinhold (1989).

The dry-films may be prepared, for example, by coating the photosensitive composition onto a carrier substrate, for example, by meniscus coating, spray coating, roller coating, wire roll coating, doctor blade coating, curtain coating and the like, typically to a dry thickness of from 5 to 150 microns. The coated carrier substrate may be dried, for example, by convection drying, infrared drying, air drying and the like, typically to a solvent content of from 0 to 10 wt %, typically less than 5 wt % or from 2 to 5 wt %, based on the polymeric layer. The carrier substrate may be in the form of discrete sheets, typically from 2 to 150 cm in width and from 2 to 150 cm in length, which may be coated and dried as sheets and stacked. The carrier sheet may further be in the form of a roll, typically from 2 to 150 cm in width and from 0.5 to 1000 meters in length, which may be coated and dried in a reel-to-reel format, commonly known as a web coating process. The protective cover layer may be applied, for example, by lamination with or without heat and/or pressure. The protective cover sheet is peeled away from the dry-film, and the dry-film is affixed to a substrate (e.g., electronic substrate), for example, by lamination. The polymeric layer is next imaged and patterned as described above. Depending on its material of construction, the dry-film carrier substrate is removed from the polymeric layer before or after exposure.

The following examples are presented to illustrate further various aspects of the present invention, but are not intended to limit the scope of the invention in any aspect.

EXAMPLES

Photoresist mixtures (Samples 1-13) were prepared by combining the components listed in Table 1. The mixtures were rolled in a sealed container overnight to dissolve the components into a homogeneous solution. Each of the photoresist solutions was spin coated onto a 100 mm diameter copper coated silicon wafer. The wafers were allowed to dry undisturbed at room temperature for approximately 30 minutes, followed by drying for 15 minutes on a hot plate at 50° C., and then on a hot plate for 30 minutes at 90° C. The edge bead was removed from each wafer with acetone. The photoresist was exposed to near UV radiation at the energy shown in Table 1 using a Karl Suss MJB 3 mask aligner through a photomask bearing opaque circles of various sizes ranging from 30 to 200 μm. The thickness of the resist layer was measured (except where indicated otherwise in Table 1). The photoresist was developed by gently agitating the wafer in Megaposit™ MF™-26A developer (Rohm and Haas Electronic Materials LLC) for the time shown in Table 1. The samples were rinsed with deionized water and dried with a flow of compressed air.

The resolution, aspect ratio and sidewall angle for the samples were determined (except where indicated otherwise), with the results being shown in Table 1. The resolution is the diameter of the smallest circle of the mask pattern which resulted in a hole being defined through the photoresist layer down to the wafer surface, as determined by visual inspection using a microscope. The aspect ratio was calculated as the thickness divided by the resolution. The sidewall angle was measured by viewing the resolution-determining hole in cross-section using optical microscopy after fracturing the wafer along the hole. The sidewall angle is the angle interior to the photoresist between the photoresist side wall and the substrate. The results of the evaluation are shown in Table 1.

TABLE 1

| Sample | 1 (Comp.) | 2 | 3 | 4 | 5 | 6 | 7 |
|---|---|---|---|---|---|---|---|
| MEHQ (g) | 0.045 | | | | | 0.023 | |
| TEMPO (g) | | 0.045 | | | | | |
| HO-TEMPO (g) | | | 0.045 | | | 0.023 | 0.045 |
| BHO-TEMPO (g) | | | | 0.045 | | | |
| Ac-TEMPO (g) | | | | | 0.045 | | |
| Oil Blue N (g) | 0.005 | 0.005 | 0.005 | 0.005 | 0.005 | 0.005 | 0.005 |
| ITX (g) | 0.06 | 0.06 | 0.06 | 0.06 | 0.06 | 0.06 | 0.06 |
| I-907 (g) | 0.3 | 0.3 | 0.3 | 0.3 | 0.3 | 0.3 | 0.3 |
| TPPSN (g) | 0.047 | 0.047 | 0.047 | 0.047 | 0.047 | 0.047 | |
| TPPST (g) | 0.047 | 0.047 | 0.047 | 0.047 | 0.047 | 0.047 | |
| SR 351LV (g) | 8.4 | 8.4 | 8.4 | 8.4 | 8.4 | 8.4 | 8.4 |
| SR 399 (g) | | | | | | | |
| Polymer Solution Comp. | A | A | A | A | A | A | A |
| Polymer Solution (g) | 37.46 | 37.46 | 37.63 | 37.55 | 37.55 | 37.46 | 37.54 |
| PGME (g) | | | | | | | |
| Thickness (microns) | 95 | 93 | 96 | 95 | 93 | 95 | 93 |
| Exp. Energy (mJ/cm$^2$) | 1000 | 1000 | 1000 | 1000 | 1000 | 1000 | 1000 |
| Development Time (min) | 8 | 8 | 8 | 8 | 8 | 8 | 8 |
| Resolution (microns) | 200 | 40 | 30 | 30 | 30 | 50 | 30 |
| Aspect Ratio | 0.48 | 2.3 | 3.2 | 3.2 | 3.1 | 1.9 | 3.1 |
| Sidewall Angle (°) | Note 1 | 93.6 | 91.8 | 91.5 | 92.1 | 93.4 | 92.1 |

| Sample | 8 | 9 | 10 | 11 | 12 | 13 (Comp.) |
|---|---|---|---|---|---|---|
| MEHQ (g) | | | | | | 0.025 |
| TEMPO (g) | | | | | | |
| HO-TEMPO (g) | 0.045 | 0.05 | 0.038 | 0.03 | 0.038 | |
| BHO-TEMPO (g) | | | | | | |
| Ac-TEMPO (g) | | | | | | |
| Oil Blue N (g) | 0.005 | 0.01 | 0.017 | 0.017 | 0.017 | 0.017 |
| ITX (g) | 0.06 | 0.06 | 0.05 | 0.125 | 0.05 | 0.124 |
| I-907 (g) | 0.3 | 0.3 | 0.25 | 0.25 | 0.25 | 0.188 |
| TPPSN (g) | 0.047 | | | | | |
| TPPST (g) | | 0.05 | | | | |
| SR 351LV (g) | 8.4 | 8.4 | 7 | 6.25 | 7 | |
| SR 399 (g) | | | | | | 8.75 |
| Polymer Solution Comp. | A | A | B | C | D | E |
| Polymer Solution (g) | 37.46 | 37.5 | 32.5 | 33.5 | 33.93 | 30.58 |
| PGME (g) | | | 0.5 | 0.5 | | 0.65 |
| Thickness (microns) | 96 | 93 | nm | 100 | nm | 76 |
| Exp. Energy (mJ/cm$^2$) | 1000 | 1000 | 1000 | 750 | 1000 | 1500 |
| Development Time (min) | 8 | 8 | 7 | 12 | 8 | 3.8 |
| Resolution (microns) | 40 | 30 | 30 | 40 | 50 | 120 |
| Aspect Ratio | 2.4 | 3.1 | nm | 2.5 | nm | 0.6 |
| Sidewall Angle (°) | 92.1 | 92.7 | nm | nm | nm | nm |

Polymer Solutions:
A: MAA/MMA/EA (8/81.25/10.75 weight ratio) polymer ($M_w$ = 12,900) with PGME (56.31 wt % solids)
B: EA/IBOMA/MMA/HEMA/MAA (28/20/37/5/10 weight ratio) polymer ($M_w$ = 20,000) with PGME (54.3 wt % solids)
C: EA/MMA/MAA (25/65/10 weight ratio) polymer ($M_w$ = 19,700) with PGME (54.7 wt % solids)
D: BMA/MMA/HEMA/MAA (45/30/10/15 weight ratio) polymer ($M_w$ = 29,800) with PGME (52.2 wt % solids)
E: EA/IBOMA//MAA (39/43/18 weight ratio) polymer ($M_w$ = 25,500) with PGME (52.1 wt % solids)
Abbreviations: MAA (Methacrylic acid); MMA (Methyl methacrylate); EA (Ethyl acrylate); HEMA (2-hydroxyethylmethacrylate); IBOMA (isobornyl methacrylate, MEHQ (hydroquinonemonomethyl ether); TEMPO (2,2,6,6-tetramethyl-1-piperidinyloxy); HO-TEMPO (4-Hydroxy-2,2,6,6-tetramethylpiperidine1-oxyl); BHO-TEMPO (4-Hydroxy-2,2,6,6-tetramethylpiperidine 1-oxyl benzoate); Ac-TEMPO (4-Acetamido-2,2,6,6-tetramethylpiperidine 1-oxyl);Oil Blue N (1,4-Bis(pentylamino)-anthraquinone); ITX (Isopropyl-9H-thioxanthen-9-one); I-907 (Ciba-Geigy Irgacure 907(2-methyl-4'-(methylthio)-2-morpholinopropiophenone); TPPSN (Triphenylphosphine); TPPST (Triphenyl phosphite); PGME (Propylene glycolmonomethyl ether); SR 351LV (Sartomer SR 351LV (trimethylolpropane triacrylate)); SR 399 (Sartomer SR 399 (dipentaerythritol ether, pentaacrylate)); nm (not measured).
Note 1:
The profile of the sidewalls of this sample were not straight. The top half of the sidewall tapered at an angle of 76° whilethe bottom half of the line tapered at 94° such that the sidewall at half the film thickness extended into the hole, giving the hole an hourglass shape.

Based on the results presented above, comparative Samples 1 and 13 resulted in significantly lower resolution (200 and 120 μm, respectively) compared with Samples 2-12 in accordance with the invention, which ranged from 30 to 50 μm. In addition, Samples 2-9 and 11 resulted in aspect ratios (from 2.3 to 3.2) which were significantly greater than both comparative Samples 1 and 13 (0.48 and 0.6, respectively). Finally, the sidewall angles for measured Samples 2-9 were each within 4° of a vertical (i.e., 90°) profile. In contrast, the hole profile for Comparative Sample 1 was of an hourglass shape.

What is claimed is:
1. A method of forming a patterned layer on a substrate, comprising:
(a) disposing over a substrate a photosensitive layer comprising a composition comprising: a binder polymer prepared by free radical polymerization of acrylic acid and/or methacrylic acid with one or more monomers chosen from acrylate monomers, methacrylate monomers and vinyl aromatic monomers; a free radical polymerizable monomer bearing two or more ethylenically unsaturated groups, a free radical photoinitiator; and a stable free radical inhibitor, wherein the stable free radical inhibitor is present in the composition in an amount of from 0.04 to 0.3 wt % based on the total weight of the composition;
(b) imagewise exposing the photosensitive Layer to actinic radiation; and
(c) developing the exposed layer, thereby forming a patterned layer;
wherein (a) comprises coating the photosensitive layer by spin coating in a single application, and wherein one or more portion of the patterned layer has an aspect ratio of 1.5 or more.

2. The method of claim 1, wherein (a) comprises coating the photosensitive layer to a dried thickness of at least 50 microns by spin coating in a single application.

3. The method of claim 1, wherein the substrate is a semiconductor wafer, the method further comprising:
(d) depositing a metal over exposed areas of the substrate; and
(e) removing the patterned layer to provide a semiconductor wafer having metal bumps.

4. The method of claim 1, wherein the stable free radical inhibitor comprises 2,2,6,6-tetramethyl-1-piperidinyloxy, 2,2-diphenyl-1-picrylhydrazyl, or a derivative thereof.

5. The method of claim 1, wherein (a) comprises coating the photosensitive layer to a dried thickness of at least 100 microns by spin coating in a single application.

6. The method of claim 1, wherein the binder polymer is prepared by free radical polymerization of ethyl acrylate, methyl methacrylate, and methacrylic acid.

7. A method of forming a patterned layer on a substrate, comprising:
(a) disposing over a substrate a photosensitive layer comprising a composition comprising: a binder polymer prepared by free radical polymerization of acrylic acid and/or methacrylic acid with one or more monomers chosen from acrylate monomers, methacrylate monomers and vinyl aromatic monomers; a free radical polymerizable monomer bearing two or more ethylenically unsaturated groups, a free radical photoinitiator; and a stable free radical inhibitor, wherein the stable free radical inhibitor is present in the composition in an amount of from 0.04 to 0.3 wt % based on the total weight of the composition;
(b) imagewise exposing the photosensitive layer to actinic radiation; and
(c) developing the exposed layer, thereby forming a patterned layer;
wherein the composition has a total solids content of 45 wt % or greater.

8. The method of claim 7, wherein (a) comprises coating the photosensitive layer to a dried thickness of at least 50 microns by spin coating in a single application.

9. The method of claim 7, wherein the substrate is a semiconductor wafer, the method further comprising:
(d) depositing a metal over exposed areas of the substrate; and
(e) removing the patterned layer to provide a semiconductor wafer having metal bumps.

10. The method of claim 7, wherein the stable free radical inhibitor comprises 2,2,6,6-tetramethyl-1-piperidinyloxy, 2,2-diphenyl-1-picrylhydrazyl, or a derivative thereof.

11. The method of claim 7, wherein (a) comprises coating the photosensitive layer to a dried thickness of at least 100 microns by spin coating in a single application.

12. The method of claim 7, wherein the binder polymer is prepared by free radical polymerization of ethyl acrylate, methyl methacrylate, and methacrylic acid.

13. The method of claim 7, wherein (a) comprises applying a dry-film photoresist to the substrate.

\* \* \* \* \*